United States Patent
Ding et al.

(10) Patent No.: US 7,626,421 B2
(45) Date of Patent: Dec. 1, 2009

(54) INTERFACE CIRCUIT AND ELECTRONIC DEVICE

(75) Inventors: Lin-Kun Ding, Shenzhen (CN);
Xiang-Ping Zhou, Shenzhen (CN);
Jiang-Feng Shan, Shenzhen (CN);
Shih-Fang Wong, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/934,091

(22) Filed: Nov. 2, 2007

(65) Prior Publication Data
US 2008/0265939 A1    Oct. 30, 2008

(30) Foreign Application Priority Data
Apr. 30, 2007    (CN) .................... 2007 1 0200582

(51) Int. Cl.
*H03K 19/0175*    (2006.01)

(52) U.S. Cl. .................... 326/82; 326/62; 327/415; 327/547

(58) Field of Classification Search .................... 326/82, 326/62; 327/415, 416
See application file for complete search history.

(56) References Cited

U.S. PATENT DOCUMENTS

| 4,027,208 | A | 5/1977 | Look |
| 6,351,175 | B1 * | 2/2002 | Rapp .................... 327/415 |
| 6,772,380 | B1 * | 8/2004 | Ali et al. .................... 714/724 |

* cited by examiner

*Primary Examiner*—Daniel D Chang
(74) *Attorney, Agent, or Firm*—Frank R. Niranjan

(57) ABSTRACT

An interface circuit and an electronic device are used for expanding an output port of a micro processing unit. The interface circuit includes an input port electrically connected to the output port of the micro processing unit for receiving a control signals, and a plurality of output ports selectively driven to control external circuits by inputting different values of the control signal at the input port.

10 Claims, 5 Drawing Sheets

INTERFACE CIRCUIT AND ELECTRONIC DEVICE

BACKGROUND

1. Field of the Invention

The present invention generally relates to interface circuits, and more particularly to an interface circuit capable of controlling a plurality of external circuits using at least one port, and an electronic device using the interface circuit.

2. Description of Related Art

Many electronic devices such as CD/DVD players, MP3 players, and mobile phones are widely used. Almost every such electronic device includes a plurality of input/output ports for communicating with other electronic devices such as earphones, keyboard, display, and so on.

Typically, as illustrated in FIG. 5, a traditional electronic device 10 includes a micro-processor unit (MPU) 100 provided with output ports 103, 105, and 107. The output ports 103, 105, 107 are connected to external circuits such as illuminating circuits 112, 114, and 116 respectively. The illuminating circuits 112, 114, and 116 have the same structure, just the illuminating circuit 112 will be explained as an example. The output port 103 is connected to the base of a transistor Q21 of the illuminating circuit 112. The collector of the first transistor Q21 is for receiving a 3.3 volts via a resistor R1 and a light-emitting diode (LED) D21. The emitter of the transistor Q21 is grounded. In order to drive the diode D21 to emit light, the MPU 100 outputs a high level voltage signal from the port 103 to the base of the transistor Q21 to turn on the transistor Q21. The output ports 105 and 107 are configured for driving the illuminating circuits 114 and 116 in a similar way. However, each of the illuminating circuits 112, 114, 116 must occupy a separate port.

Therefore, what is needed in the industry is to provide an interface circuit capable of using just one port to control a plurality of external circuits, and an electronic device using the interface circuit.

SUMMARY

Accordingly, an interface circuit and an electronic device according to a preferred embodiment is provided. The interface circuit is configured for expanding at least an output port of a micro processing unit. The interface circuit includes an input port electrically connected to the output port of the micro processing unit for receiving control signals, and a plurality of output ports to be driven selectively to control external circuits by inputting different values of the control signal at the input port.

DETAILED DESCRIPTION

Figure 1:
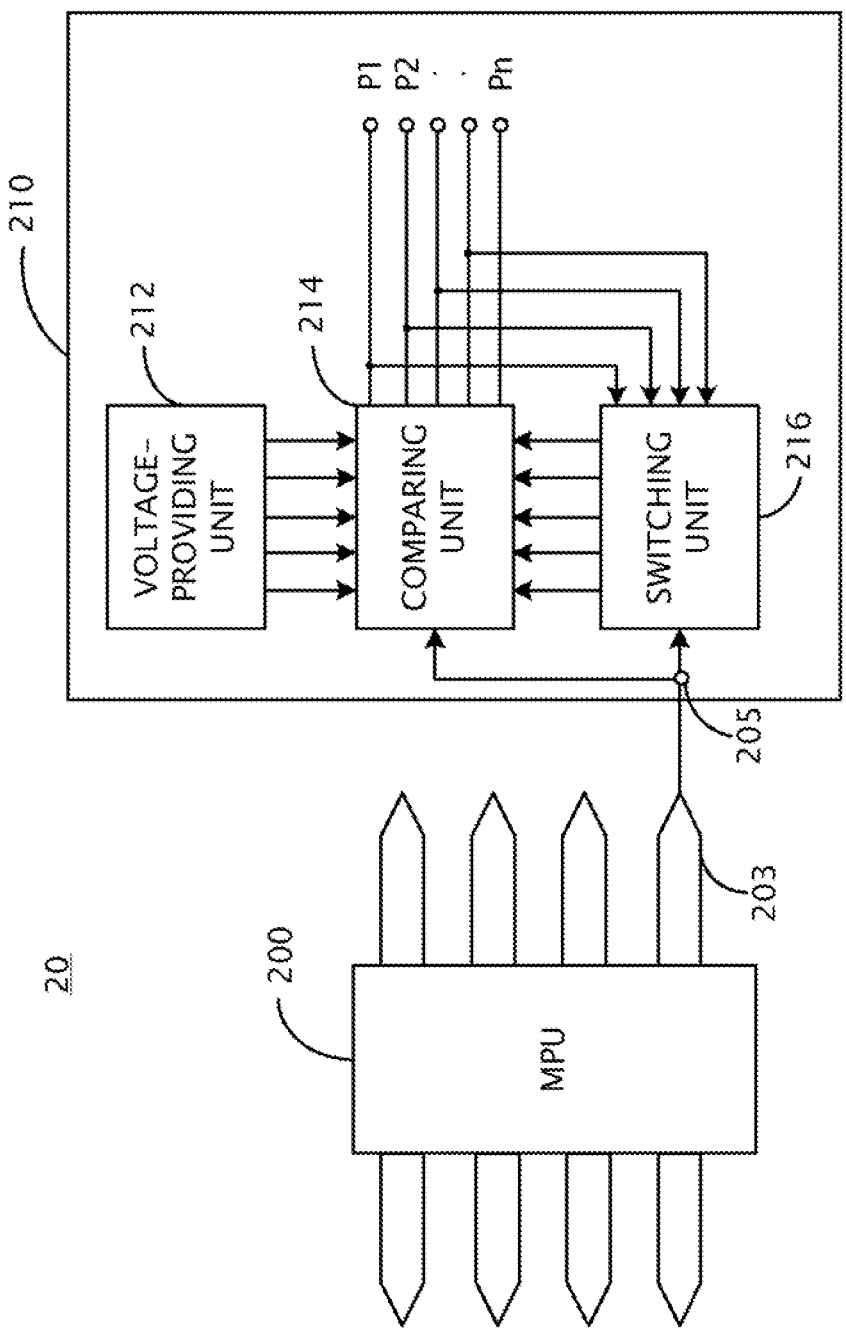
FIG. 1 is a block diagram of an electronic device, the electronic device including an interface circuit.
Figure 5:
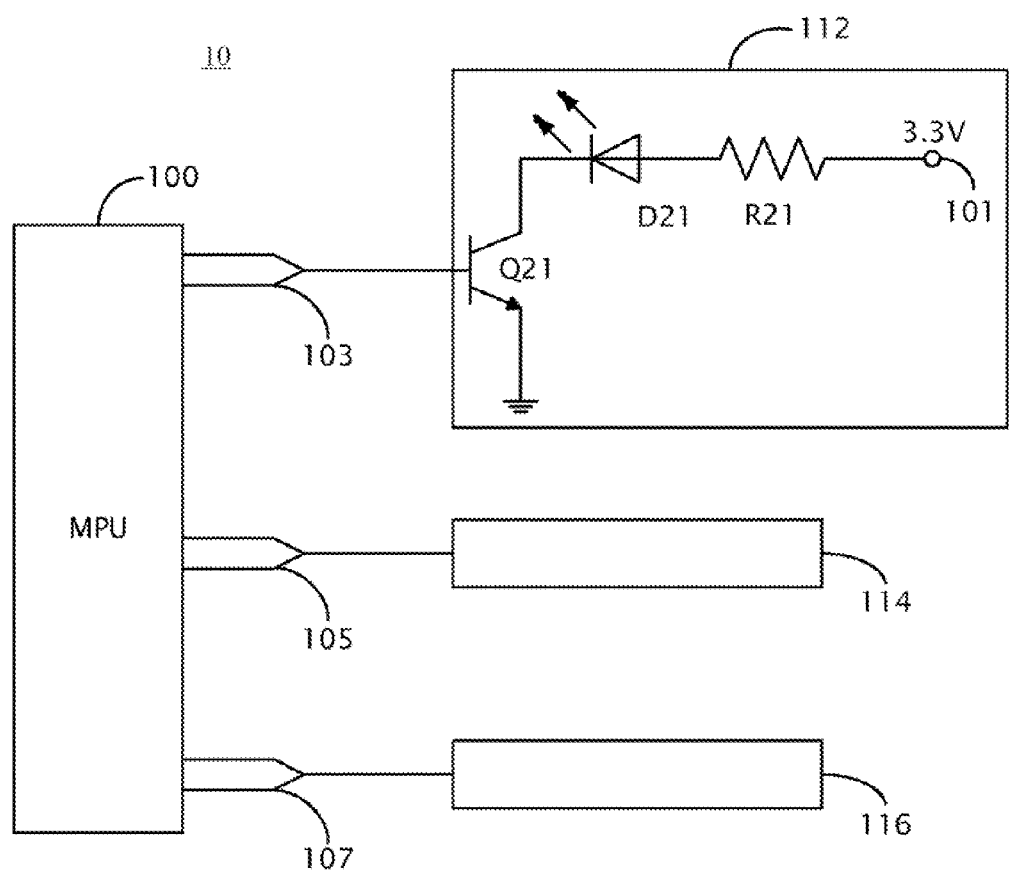
FIG. 5 is a block diagram showing a conventional electronic device.

Referring to FIG. 1, an electronic device 20 such as an MP3 player or a DVD player is provided for controlling a plurality of external circuits such as the illuminating circuits 112, 114, and 116 illustrated in FIG. 5. It should be noted that and other type of external circuits may also be applied. Only the features referred to in the following description are illustrated. It should be noted that the electronic device 20 may comprise additional features, such as displaying images, outputting voices, wireless telecommunication, and gaming function known in the art that are not illustrated.

The electronic device 20 includes a micro processing unit (MPU) 200 and an interface circuit 210. The MPU 200 may be a digital signal processor (DSP) chip of an MP3 player or a DVD player. The MPU 200 includes a plurality of output ports 201 for outputting control signals thereof.

The interface circuit 210 includes an input port 205, a voltage-providing unit 212, a comparing unit 214, a switching unit 216, and a plurality of output ports P1, P2, ... Pn, wherein the number n is a natural number greater than or equal to two. The input port 205 is electrically connected to the one of the output ports 201 of the MPU 200 for receiving the control signals therefrom. Each of the output ports P1, P2, ... Pn of the interface circuit 210 is enabled according to a corresponding control signal provided from the output port 201. In a preferred embodiment, the control signals outputted from the output port 201 are voltage signals with different values. That is, each control signal having its own value is used for enabling a corresponding output port P1, P2, ... Pn. In other embodiments, the control signals may vary in other ways such as PWM (Pulse-Width Modulation) signals, and so on.

The voltage-providing unit 212 is configured for providing a series of reference voltages. The comparing unit 214 is configured for receiving the reference voltages output from the voltage-providing unit 212, and receiving the control signals output from the input port 205. The control signals are preferred control voltage defined by the voltage-providing unit 212. The comparing unit 214 compares one of the reference voltages with the control voltage, and outputs a first driving signal correspondingly. The first driving signal may be a high level voltage signal or a low level voltage signal. The first driving signal is then output to a first output port of P1, P2, ... Pn. The first output port is driven by changing its state from a low level signal to a high level signal or from a high level signal to a low level signal. Meanwhile, the first driving signal is fed to the switching unit 216. If the first output port is driven i.e., having states changed, the switching unit 216 is switched off based on the first driving signal causing the other output ports not to be driven.

If the first output port is not driven, i.e., not having states changed, the switching unit 216 is switched on based on the first driving signal. Then the comparing unit 214 compares another reference voltage with the control voltage, and produces a second driving signal correspondingly. The second driving signal is output to a second output port of P1, P2, ... Pn different from the first output port. The first output port is driven by changing its state from a low level signal to a high level signal or from a high level signal to a low level signal. Meanwhile, the second driving signal is fed to the switching unit 216 again. If the second output port is driven, the switching unit 216 is switched off based on the second driving signal, causing the other output ports not to be driven. If the second output port is not driven, the comparing unit 214 compares still another reference voltage with the control voltage, and outputs a third driving signal to a third output port of P1, P2, ... Pn different from the first output port and the second output port. This process is repeated till one of the output ports P1, P2, ... Pn to be driven. Such that, the control voltage just control one output port of the interface circuit 210.

Figure 2:
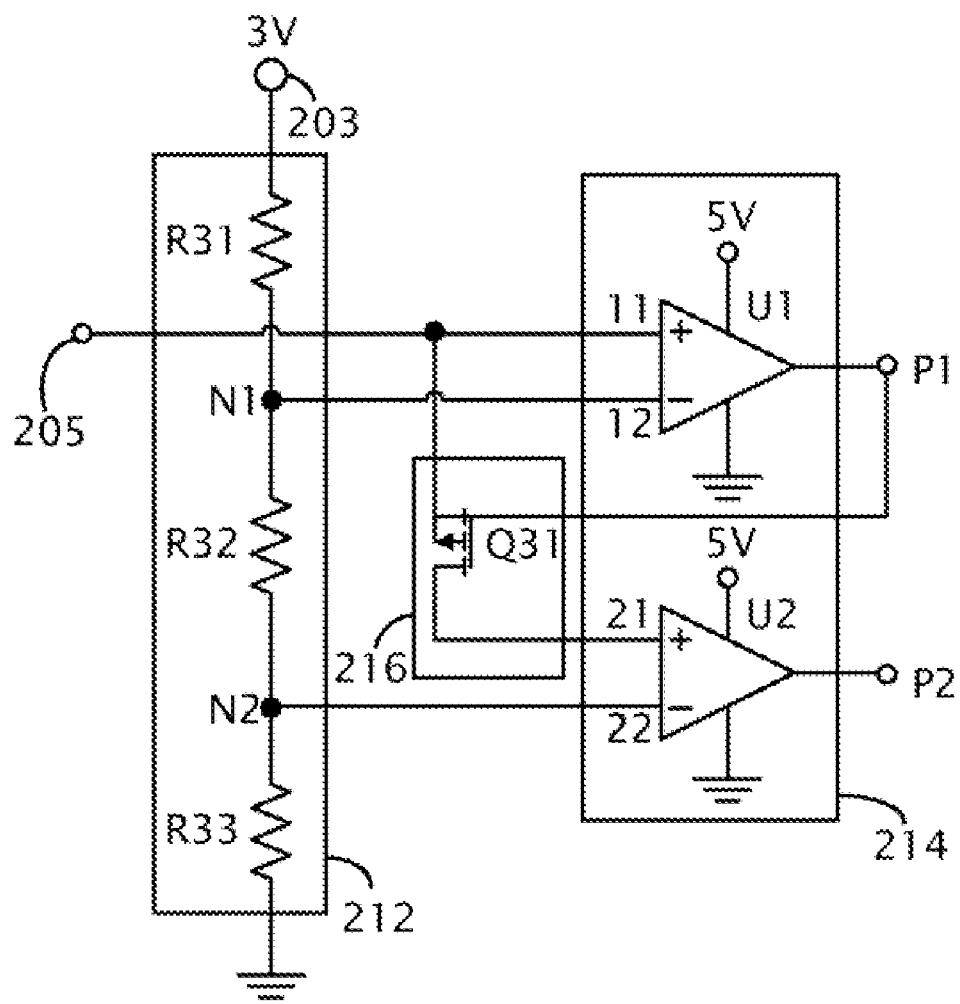
FIG. 2 is a circuit diagram showing a first embodiment of the interface circuit shown in FIG. 1.

Referring to FIG. 2, the interface circuit 210 in accordance with a first preferred embodiment will be described.

The voltage-providing unit 212 includes three resistors R31, R32, and R33 that are serially connected between a voltage source 203 and ground. The voltage source 203 provides a 3 volts voltage. The resistance of each of the three resistors R31, R32, and R33 is approximately 1K ohms.

The comparing unit 214 includes two comparators U1 and U2. The positive input terminal 11 of the comparator U1 is electrically connected to the switching unit 216, and is configured for receiving a control voltage from the input port 205. The negative input terminal 12 of the comparator U1 is configured for receiving a first reference voltage from a joint node N1 between the resistors R31 and R32. The positive input terminal 21 of the comparator U2 is electrically connected to the switching unit 216. The negative input terminal 22 of the comparator U2 is configured for receiving a second reference voltage from a joint node N2 between the resistors R32 and R33. Both the comparators U1 and U2 have a 5 volts voltage supplied and one terminal grounded.

The switching unit 216 includes a transistor Q31. The transistor Q31 is a p-channel Enhancement Metal Oxide Semiconductor Field Effect Transistor (E-MOSFET). The source of the transistor Q31 is electrically connected to the input port 205 and the positive input terminal 11 of the comparator U1. The drain of the transistor Q31 is electrically connected to the positive input terminal 21 of the comparator U2. The gate of the transistor Q31 is electrically connected to the output terminal of the comparator U1, i.e., the output port P1. The output terminal of the comparator U2 is connected to the output port P2.

The operation of the interface circuit 210 in accordance with the first preferred embodiment will be described. First, the voltage source 203 is supplied with the 3 volts voltage, and the voltage-providing unit 212 outputs a 2 volts first reference voltage at the joint node N1, and a 1 volt second reference voltage at the joint node N2.

Then, the input port 205 is supplied with a control voltage with a value in a range from 2 to 3 volts, for example 2.2 volts. As the control voltage of the positive input terminal 11 is higher than the reference voltage of the negative input terminal 12, the comparator U1 outputs a high level voltage signal to the output port P1. Meanwhile, the high level voltage signal at the output port P1 is applied to the gate of the transistor Q31, and the transistor Q31 is turned off accordingly. In this condition, the transistor Q31 is equivalent to a high value resistor in the path from the input port 205 to the positive input terminal 21, thereby the voltage value at the positive input terminal 21 is nearly 0. As such, the voltage at the positive input terminal 21 is lower than that of the negative input terminal 22, and the comparator U2 outputs a low level voltage signal to the output port P2.

Then the control voltage with a different value in a range from 1 to 2 volts, for example 1.2 volts, is input to the input port 205. The comparator U1 outputs a low level voltage signal to the output port P1, and the low level voltage signal is applied to the gate of the transistor Q31. The transistor Q31 is turned on accordingly, causing the control voltage to be applied to the positive input terminal 21 of the comparator U2. The comparator U2 outputs a high level voltage signal to the output port P2.

As depicted in the first preferred embodiment, the interface circuit 210 is capable of enabling different output ports P1 and P2 by inputting control voltages with different values at the single input port 205. The high level voltage signal at the output port P1 and the low level voltage signal at the output port P2 is corresponding to the control voltage having a value between the source voltage 203 and the first reference voltage at the joint node N1. The low level voltage signal at the output port P1 and the high level voltage signal at the input port P2 correspond to the control voltage having a value between the first reference voltage at the joint node N1 and the second reference voltage at the joint node N2. In other words, the single output port 205 of the MPU 200 is expanded to two outputs P1 and P2 by the interface circuit 210 for controlling external circuits respectively.

Figure 3:
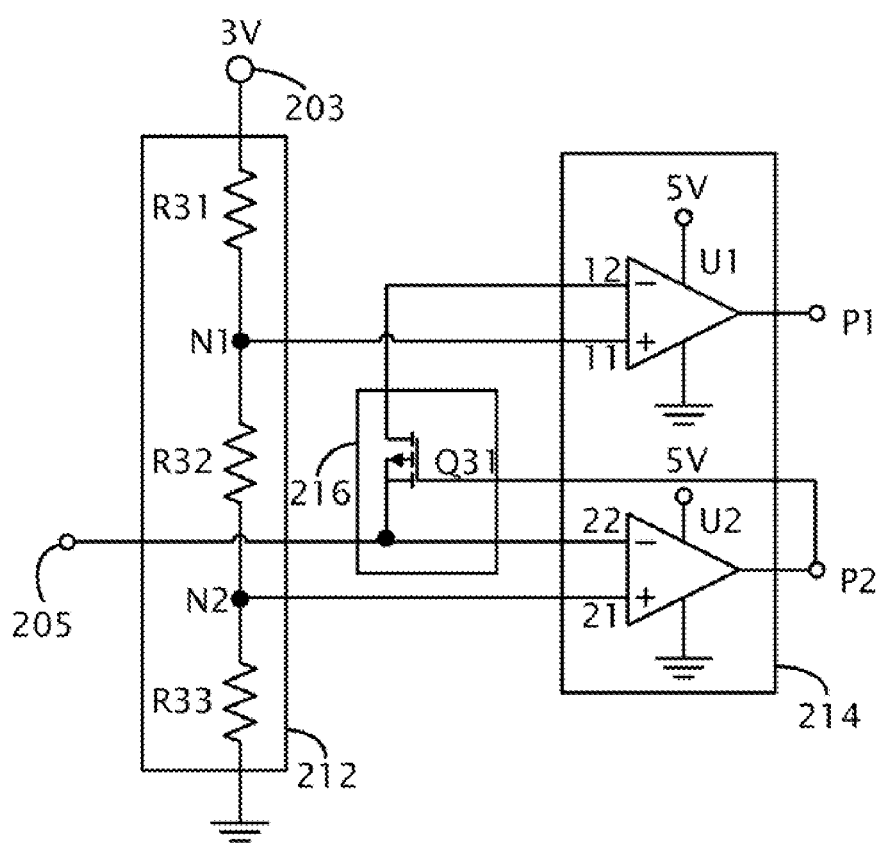
FIG. 3 is a circuit diagram showing a second embodiment of the interface circuit shown in FIG. 1.

Referring to FIG. 3, the interface circuit 310 in accordance with a second preferred embodiment will be described. As the interface circuit 310 is similar to the interface circuit 210, only the different portions will be described. The input port 205 is electrically connected to the negative input terminal 22 of the comparator U2 and the source of the transistor Q31. The output ports P1 and P2 are electrically connected to the output terminals of the comparator U1 and U2 respectively. The positive input terminal 21 of the comparator U2 is electrically connected to the joint node N2. The positive input terminal 11 of the comparator U1 is electrically connected to the joint node N1. The negative input terminal 12 of the comparator U1 is electrically connected to the drain of the transistor Q31. The gate of the transistor Q31 is electrically connected to the output port P2.

The operation of the interface circuit 310 in accordance with the second preferred embodiment will be described. First, the control voltage with a value from 0 to 1 volt, for example 0.8 volts, is output to the input port 205. The 1 volt second reference voltage is applied to the positive input terminal 21, such that the comparator U2 outputs a high level voltage signal to the output port P2, and the high level voltage signal is applied to the gate of the transistor Q31. The transistor Q31 is turned off accordingly, causing a voltage near to 0 to be applied to the negative input terminal 12 of the comparator U1. The comparator U1 outputs a high level voltage signal accordingly.

Then, the control voltage with a different value ranging from 0 volt to 1 volt is output to the input port 205. The 1 volt second reference voltage is applied to the positive input terminal 21, such that the comparator U2 outputs a low level voltage signal to the output port P2, and the low level voltage signal is applied to the gate of the transistor Q31. The transistor Q31 is turned on accordingly. Such that the 1.8 volts control voltage is applied to the negative input terminal 12. The 2 volts first reference voltage is applied to the positive input terminal 11, thereby the comparator U1 outputs a high level voltage signal to the output port P1.

As depicted in the second preferred embodiment, the interface circuit 310 is capable of enabling different output ports P1 and P2 by inputting control voltages of different values in a range defined by the voltage-providing unit to the single input port 205. The high level voltage signal at the output port P1 and the high level voltage signal at the output port P2 correspond to the control voltage of a value between the second reference voltage at the joint node N2 and the ground voltage. The high level voltage signal at the output port P1 and the low level voltage signal at the input port P2 correspond to the control voltage with a value between the first reference voltage at the joint node N1 and the second reference voltage at the joint node N2. Likewise, the single output port 205 of the MPU 200 is also expanded into two outputs P1 and P2 by the interface circuit 310 for controlling external circuits respectively.

Figure 4:
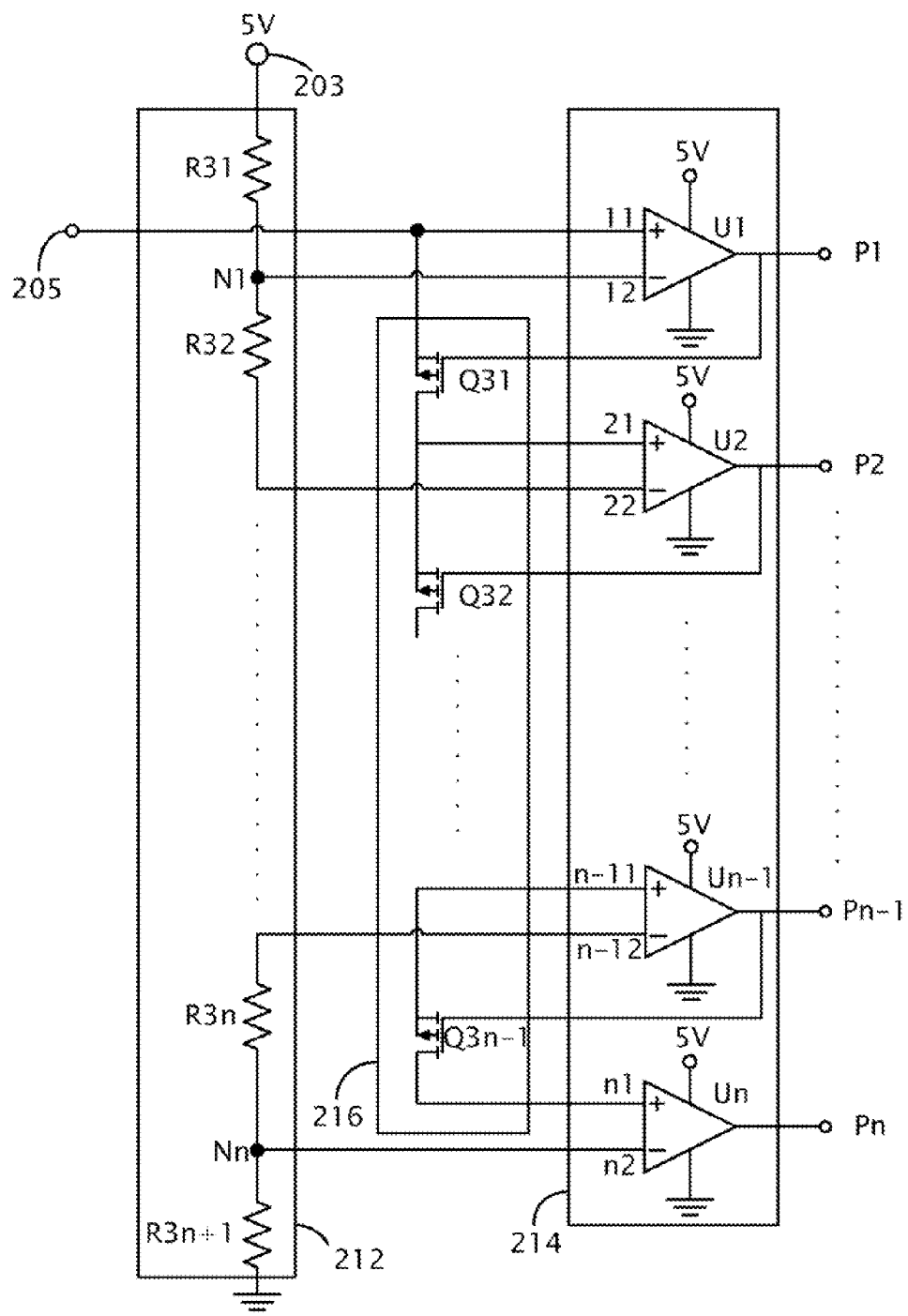
FIG. 4 is a circuit diagram showing a third embodiment of the interface circuit shown in FIG. 1.

Referring to FIG. 4, the interface circuit 410 in accordance with a third preferred embodiment will be described. The interface circuit 410 may be constructed by increasing corresponding elements of the voltage-providing unit 212, the comparing unit 214, and the switching unit 216 as shown in the interface circuit 210. The interface circuit 410 includes a single input port 205, and a plurality of output ports represented by P1, P2, ... Pn−1, and Pn, wherein n is a natural number greater than or equal to two. The voltage-providing unit 216 includes n+1 resistors R31, R32, ... R3n, and R3n+1 serially connected between the voltage source 203 and ground. The comparing unit 214 includes n comparators U1, U2, ... and Un. The output terminal of the comparators U1, U2, and Un are connected to the output ports P1, P2, ... On respectively. The switching unit 216 includes n−1 transistors Q31, Q32, ... Q3n−1. These transistors are also p-channel E-MOSFET. The source of the transistor Q3n−1 is electrically connected to the positive input terminal n−11 of the comparator Un−1. The drain of the transistor Q3n−1 is electrically connected to the positive input terminal n1 of the comparator Un. The gate of the transistor is electrically connected to the output terminal of the comparator Un−1 i.e., the output port Pn−1. The common connecting relationship between the transistor Q32 and Q3n−1 is that the drain of the n−1 transistor is electrically connected to the source of the n transistor.

The operation of the interface circuit 410 is similar to the interface circuit 210. First, the control voltage with a value in a predetermined range from the source voltage 203 to the first reference voltage at the joint node N1 is output to the input port 205. The comparator U1 outputs a high level voltage signal to the output port P1, and the high level voltage signal is applied to the gate of the transistor Q31. The transistor Q31 is turned off accordingly, causing a voltage of nearly 0 to be applied to the comparators U2, U3, ... Un−1, and Un. As the negative input terminals of the comparators U2, U3, ... Un−1, and Un are all higher than 0 volt, such that the output ports P2, O3, ... Pn−1, and Pn all output low level voltage signals.

Then, the control voltage having a different value in a range from the n reference voltage to the n−1 reference voltage is output to the input port 205. The comparators U1, U2, ... Un−1 output low level voltage signals to the output ports P1, P2, ... Pn−1 respectively. The low level voltage signals are applied to the transistors Q1, Q2, ... Q3n−1, causing these transistors to be turned on. Then the control voltage is applied to the positive input terminal n11 of the comparator Un. The control voltage at the positive input terminal n11 is lower than that of the negative input terminal n12, such that the comparator Un outputs a high level voltage signal to the output port Pn.

As depicted in the third preferred embodiment, the interface circuit 410 is also capable of enabling different output ports P1, P2, ... Pn by inputting control voltages to the single input port 205 with different values in a range defined by the voltage-providing unit 216.

Therefore, when implementing the interface circuits 210, 310, 410 depicted above, external circuits such as illuminating circuits 112, 114, 116 and so on as shown in the related art FIG. 5 should be controlled independently. By providing control voltages to the input port 205 with different values defined by the voltage-providing unit, at least one of the illuminating circuits may be selectively driven to illuminate lights. By using these interface circuit, the port resources of the MPU may be saved to drive other circuits such as those for earphones, keyboard, mouse and so on to perform specific functions.

Alternative embodiments will become apparent to those skilled in the art to which the present invention pertains without departing from its spirit and scope. For example, the functions of interface circuits 210, 310, 410 may be built-in feature of the MPU 200. Accordingly, the scope of the present invention is defined by the appended claims rather than the foregoing description and the exemplary embodiments described therein.

What is claimed is:

1. An interface circuit for expanding at least one output port of a micro processing unit, the interface circuit comprising:
   an input port electrically connected to one of the output port of the micro processing unit for receiving analog control signals therefrom;
   a plurality of output ports electrically connected to a plurality of external circuits respectively, one of the plurality of output ports being selectively driven to control one of the corresponding external circuits by inputting the analog control signals to the input port with different analog voltage values;
   a voltage-providing unit configured for providing a series of reference voltages;
   a comparing unit electrically connected to the voltage-providing unit, the comparing unit configured for receiving the analog control signals output from the input port of the interface circuit, and receiving the reference voltages output from the voltage-providing unit; and
   a switching unit electrically connected to the comparing unit, the switching unit configured for receiving the analog control signals outputted from the input port and the output ports, and receiving an output signal from the comparing unit.

2. The interface circuit as claimed in claim 1, wherein the voltage-providing unit comprises n+1 resistors that are serially connected between a power source and ground, wherein the number n is a natural number greater than or equal to two; the comparing unit comprises n comparators, the output terminals of the comparators are electrically connected to the output ports respectively; and the switching unit comprises n−1 transistors, the drain of the n−1 transistor is electrically connected to the source of the n transistor.

3. The interface circuit as claimed in claim 2, wherein the resistance values of the resistors are approximately equal to each other.

4. The interface circuit as claimed in claim 1, wherein the transistors in the switching unit are p-channel enhancement metal oxide semiconductor field effect transistor (E-MOSFET).

5. An electronic device for communicating with at least one external circuit, the electronic device comprising:
   a micro processor unit comprising a plurality of first output ports; and
   an interface circuit comprising:
       an input port electrically connected to one of the plurality of first output ports of the micro processor unit for receiving a control signal output thereof;
       a plurality of second output ports electrically connected to the external circuits respectively, at least one of the second output ports being driven by inputting different values of the control signal at the input port; wherein the control signal is an analog voltage signal, the analog voltage signal being variable in voltage value to drive the second output ports with different voltages;
       a voltage-providing unit configured for providing a series of reference voltages;
       a comparing unit electrically connected to the voltage-providing unit, the comparing unit configured for receiving the control voltage output from the input port of the interface circuit, and receiving the reference voltage output from the voltage-providing unit; and a switching unit electrically connected to the comparing unit, the switching unit configured for receiving the control voltage output from the input port, and receiving an output signal from the comparing unit.

6. The electronic device as claimed in claim 5, wherein the voltage-providing unit comprises n+1 resistors that are serially connected, wherein the number n is a natural number greater than or equal to two; the comparing unit comprises n comparators, the output terminals of the comparators are electrically connected to the second output ports respectively; and the switching unit comprises n−1 transistors, the drain of the n−1 transistor is electrically connected to the source of the n transistor.

7. The electronic device as claimed in claim 6, wherein the resistance values of the resistors are approximately equal to each other.

8. The electronic device as claimed in claim 6, wherein the transistors in the switching unit are p-channel enhancement metal oxide semiconductor field effect transistor (E-MOSFET).

9. An interface circuit adapted to use an output port of a micro processing unit to control at least three external circuits, the interface circuit comprising:

an input port electrically connected to the output port of the micro processing unit for receiving an analog voltage signal therefrom;

a first output port electrically connected to a first external circuit;

a second output port electrically connected to a second external circuit;

a third output port electrically connected to a third external circuit;

wherein when the input port receives the analog voltage signal having an analog voltage value selected from a first range, the first output port is enabled, and the second output port and the third output port are disabled;

when the input port receives the analog voltage signal having an analog voltage value selected from a second range, the first output port is disabled and the third output port are disabled, and the second output port is enabled;

when the input port receives the analog voltage signal having an analog voltage value selected from a third range, the first output port and the second output port are disabled, and the third output port is enabled;

a voltage-providing unit configured for providing a series of reference voltages;

a comparing unit electrically connected to the voltage-providing unit, the comparing unit configured for receiving the analog voltage signal output from the input port of the interface circuit, and receiving the reference voltage output from the voltage-providing unit; and a switching unit electrically connected to the comparing unit, the switching unit configured for receiving the analog voltage signal output from the input port, and receiving an output signal from the comparing unit.

10. The interface circuit as claimed in claim 9, wherein the voltage-providing unit comprises n+1 resistors that are serially connected, wherein the number n is a natural number greater than or equal to two; the comparing unit comprises n comparators, the output terminals of the comparators are electrically connected to the second output ports respectively; and the switching unit comprises n−1 transistors, the drain of the n−1 transistor is electrically connected to the source of the n transistor.

* * * * *